United States Patent [19]

Hellriegel

[11] 4,349,244
[45] Sep. 14, 1982

[54] HIGH QUALITY OBJECTIVE USING AIR BEARING

[75] Inventor: Walter Hellriegel, Jena-Neulobeda, German Democratic Rep.

[73] Assignee: Jenoptik Jena GmbH, Jena, German Democratic Rep.

[21] Appl. No.: 142,922

[22] Filed: Apr. 23, 1980

[51] Int. Cl.³ .................. G02B 7/04; G02B 7/08
[52] U.S. Cl. .................. 350/255; 350/252; 350/310
[58] Field of Search ........ 350/242, 245, 247, 252–253, 350/255, 63, 71, 80, 83, 310; 353/100; 354/286; 343/878; 331/94.5 D; 333/22 F, 155, 234

[56] References Cited

U.S. PATENT DOCUMENTS

| | | |
|---|---|---|
| 2,533,371 | 12/1950 | Heine .................................. 350/255 |
| 3,081,682 | 3/1963 | Khovry ................................ 350/255 |
| 3,121,605 | 2/1964 | Nunn ................................... 350/6.1 |
| 3,154,627 | 10/1964 | Wallis ................................. 350/310 |
| 3,963,306 | 6/1976 | Martin ................................. 350/255 |
| 4,101,008 | 7/1978 | Frosch et al. ....................... 350/255 |

Primary Examiner—William H. Punter
Attorney, Agent, or Firm—Jordan and Hamburg

[57] ABSTRACT

The invention is directed to improving alignment of optical components within an overall objective cylinder along an optical axis by providing an outside source of compressed air which flows into and out of the outer hollow cylinder of the objective, through defined passages between the inside surface of the hollow objective and the imaging optical components within the hollow cylinder, to accurately align the inner optical components with an optical axis.

5 Claims, 1 Drawing Figure

HIGH QUALITY OBJECTIVE USING AIR BEARING

BACKGROUND OF THE INVENTION AND PRIOR ART STATEMENT

This invention relates to the adjustment and fastening of mounting cells of imaging optical components in a high quality objective.

For a high quality objective generally each imaging optical component is arranged in a separate metal casing. The respective imaging optical component is fit in the casing and is fastened by means of a locking ring, an adhesive connection or a spine within the mounting cell. The casings with the individual optical components match the objective cylinder and the axes of the optical components and the axis of the objective cylinder must be identical. It is not possible to avoid a tolerance play between the objective cylinder and an individual component due to circular errors and the gap play needed for the mounting process. Present mounting procedures allow even with great effort a minimum tolerance play of about 8 to 10 micrometers. This results in a de-centering of the optical axes of the individual optical components relative to each other of about 4 to 5 micrometers, and a de-centering of the optical axes of the individual optical components relative to the axis of the objective cylinder. That influences the optical performance of the high quality objective in a negative sense.

It is an object of the invention to provide an improved centering of the optical axes of the individual imaging components relative to each other and of the optical axes of the imaging optical components relative to the axis of the objective cylinder.

It is a further object of the invention to provide high quality objectives according to the principle of the mounting cells, using the advantage of the simple assembly of the mounting cells but eschewing appreciably the disadvantages of this method. In particular, a major object of the invention is to make the optical axes of the individual optical components coincident with the axis of the objective cylinder.

SUMMARY OF THE INVENTION

According to the present invention, the foregoing objectives are attained for a high quality objective consisting of a hollow cylinder with two retainers between which is arranged coaxially to the body axis of the hollow cylinder at least one cylindrical metal casing for imaging optical components and wherein the metal casing is braced by springs against one of the retainers, by providing air inlets and air outlets in the hollow cylinder. The air inlets are radially directed and run substantially at equal distance along a circumferential line of the hollow cylinder and the air outlets are also radially directed and run substantially at equal distances along another circumferential line of the hollow cylinder. The air inlets correspond to the middle circumferential line of the metal casing and the air outlets correspond to the frontal plane of the metal casing at the far end of the metal casing from the springs.

In a particularly advantageous embodiment of the invention the second retainer is provided with air inlets, disposed concentric relative to the body axis of the hollow cylinder, arranged at equal distances from each other and in the frontal plane of the metal casing. All air inlets of the hollow cylinder are connected to a compressed air (or other compressed gas) plant.

In high quality objectives having at least two cylindrical metal casings for imaging optical components, according to the invention, the metal casings are supported coaxially to the body axis of the hollow cylinder and the planes vertical to the frontal planes of the metal casings, adjacent to air outlets in the hollow cylinder, are held by an elastic packing ring. The elastic packing ring prevents the compressed air from entering the adjacent optical components. Thus an axial displacement of adjacent components is prevented. Moreover, the index of refraction of the high quality objective is not varied due to compressed air entering between the imaging optical components.

The components of the high quality objective, the hollow cylinder with two retainers and the cylindrical metal casing are centered by the action of the compressed air. The compressed air arriving from the air compressor acts upon each encased imaging optical component through the air inlet nozzles, arranged substantially at equal distances along a circumferential line at the middle of the hollow cylinder, in a radial direction. The use of compressed air within a high quality objective may be restricted to components which are in particular need of being centered, i.e., whose de-centering might strongly influence the optical efficiency of the objective.

Air blown into the cylindrical metal casing escapes through air outlet apertures, which correspond to that frontal plane of the metal casing which is arranged nearest to the second retainer. Due to the pressure drop of the compressed air between feed pressure, chamber pressure and exhaust pressure an airspace is formed between the inner wall of the hollow cylinder and the cylindrical outer plane of the metal casing which is coaxial to the optical axis. Thus, maximum centering of the air-supported metal cased imaging optical systems is obtained. One of the retainers is provided with springs which abut against the adjacent casing with a force directed parallel to the optical axis and permit the casings to shift at right angles thereto in order to be centered by the compressed air. As an alternative to the springs, there may be provided an air cushion. This method reduces the frictional forces at the frontal planes of the individual casings to a minimum, thereby further facilitating the centering of the imaging optical components.

The centered imaging optical components, according to the invention are surrounded by an annular cylindrical ring of static air and consequently, the centering remains constant independent of any ambient temperature changes. The compressed air acts as a coolant for the imaging optical components; any change of the surface geometry of the optical components caused by the energy of the incident light is counteracted.

BRIEF DESCRIPTION OF THE DRAWING

The drawing is a schematic illustration, partly in section of an objective according to the invention and means for centering the objective with compressed air.

DETAILED DESCRIPTION OF A PREFERRED EMBODIMENT OF THE INVENTION

Figure 1:
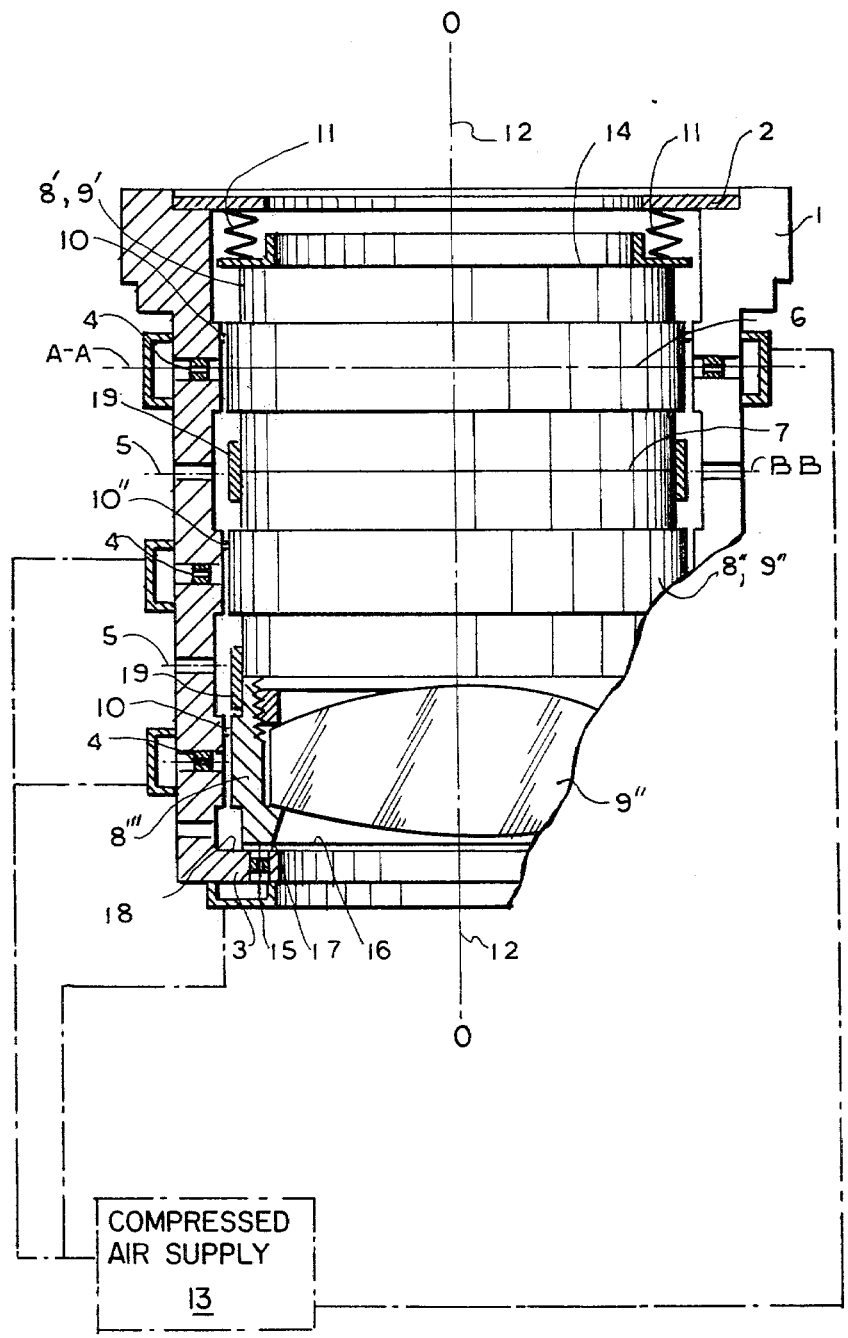

Two retainers 2 and 3 are mounted in a hollow cylinder 1 at right angles to the optical axis 0—0. Within the hollow cylinder 1 are disposed three cylindrical metal casings 8', 8'', 8''' for the respective imaging optical components 9', 9", 9'". Vertical to the tangential plane of both end surfaces 7 of respective pairs of adjacent cylindrical metal casings 8', 8", 8'", an elastic packing ring 19 surrounds a part of the circumferential plane of the metal casings 8', 8" and 8'", in order to prevent compressed air (hereinafter explained) from entering the interface of the end surfaces 7. The metal casings 8' is supported by springs 11 upon the front surface 14 which is adjacent to the retainer 2. Radially directed air inlet apertures 4 are arranged at equal distances, along a circumferential line A—A which is identical with the middle line of the cylindrical metal casing 6.

In a plane 7 of the cylindrical metal casing 8' for the imaging optical component 9' are arranged in the wall of the hollow cylinder 1 air outlet apertures 5, also radially directed and at equal distances along a circumferential line B—B. This arrangement of the air inlet apertures 4 and air outlet apertures 5 relative to the cylindrical metal casing 8' of the imaging optical component 9' is executed analogously for the metal casings 8" and 8'" of the optical components 9" and 9'".

Between the inner wall of the hollow cylinder 1 and the outer planes of the metal casings 8', 8", 8'" respective cylindrical annular air spaces 10', 10" and 10'" are formed when a compressed air supply 13 is actuated. The air spaces 10', 10", 10'" are substantially coaxial with the body axis 12 of the hollow cylinder 1, which coincides in the drawing with the optical axis 0—0.

Air inlet apertures 15 are arranged within the retainer 3 concentrically around the body axis 12 at equal distances from each other and in the frontal plane 16 of the metal casing 8'". A second air space 17 is formed between the inner wall 18 of the retainer 3 coaxially with the optical axis 0—0 when the compressed air is supplied.

What I claim is:

1. A high quality objective, comprising
(A) a cylinder,
(B) two retainers, each retainer situated at an opposite end of said cylinder,
(C) at least one casing situated in said cylinder between said two retainers,
(D) an imaging optical component within said casing,
(E) a ring-shaped air chamber between said cylinder and said casing, of minimum width at a center circumferential line of said casing and of maximum width at an end of said casing,
(F) a plurality of radial air inlets in said cylinder arranged equidistantly from one another, each air inlet directed to the center circumferential line of said casing,
(G) a plurality of radial air outlets in said cylinder, arranged equidistantly from one another and axially spaced from said air inlets (F),
(H) a compressed air supply engaged with said air inlets (F) and air outlets (G) to balance the optical component (D) with respect to an optical axis of said objective,
(I) elastic means disposed between one of said retainers (B) and an end of a casing (C) within said cylinder (A),
(J) an intermediate air chamber disposed within said cylinder between said other retainer and an end of a casing opposite the end contacting said elastic means and engaged with said ring-shaped air chamber (E), and
(K) a plurality of air inlets disposed within said latter retainer (J) concentrically around a body axis of said cylinder (A) equidistantly from one another, and engaged with said compressed air supply on one side of said latter retainer (J) and with said intermediate air chamber (J) on the other side of said latter retainer (J).

2. The objective of claim 1 in which said air outlets (G) are directed along a frontal plane of a casing (C) at the far end of the casing (C) from the elastic means (I).

3. The objective of claim 2 in which
(L) an elastic packing ring is provided around the frontal plane of the casing (C) at the far end of the casing (C) from the elastic means (I).

4. The objective of claim 3 comprising a plurality of casings (C) within said cylinder (A).

5. The objective of claim 4 in which said elastic means (I) is a spring.

* * * * *